United States Patent
Baik et al.

(10) Patent No.: US 9,773,752 B2
(45) Date of Patent: Sep. 26, 2017

(54) PRINTED CIRCUIT BOARDS AND SEMICONDUCTOR PACKAGES INCLUDING THE SAME

(71) Applicant: Samsung Electronics Co., Ltd., Suwon-si, Gyeonggi-do (KR)

(72) Inventors: Seung-hyun Baik, Seoul (KR); Cheol-woo Lee, Anyang-si (KR); Wan-ho Park, Asan-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/221,164

(22) Filed: Jul. 27, 2016

(65) Prior Publication Data

US 2017/0117252 A1  Apr. 27, 2017

(30) Foreign Application Priority Data

Oct. 26, 2015  (KR) .................. 10-2015-0148819

(51) Int. Cl.
| | |
|---|---|
| *H01L 25/065* | (2006.01) |
| *H01L 23/00* | (2006.01) |
| *H01L 23/31* | (2006.01) |

(52) U.S. Cl.
CPC ...... *H01L 25/0652* (2013.01); *H01L 23/3128* (2013.01); *H01L 24/06* (2013.01); *H01L 25/0657* (2013.01); *H01L 2224/0401* (2013.01); *H01L 2224/04042* (2013.01); *H01L 2224/48091* (2013.01)

(58) Field of Classification Search
CPC . H01L 25/0652; H01L 25/0657; H01L 24/06; H01L 23/3128
See application file for complete search history.

(56) References Cited

U.S. PATENT DOCUMENTS

| | | | | |
|---|---|---|---|---|
| 4,767,892 A | * | 8/1988 | Kobari | ................ H05K 3/3452 174/253 |
| 6,461,953 B1 | * | 10/2002 | Sakuyama | .......... H01L 21/4853 438/106 |
| 7,872,483 B2 | | 1/2011 | Han et al. | |
| 8,164,710 B2 | | 4/2012 | Kim et al. | |

(Continued)

FOREIGN PATENT DOCUMENTS

| | | | | |
|---|---|---|---|---|
| JP | 2014-146685 | | 8/2014 | |
| KR | 2005108214 | * | 11/2005 | ............... H05K 1/03 |

(Continued)

*Primary Examiner* — William Coleman
(74) *Attorney, Agent, or Firm* — Ward and Smith, P.A.

(57) ABSTRACT

A printed circuit board (PCB) for reducing a size of a semiconductor package and a semiconductor package including the same are provided. The PCB includes a substrate base including a chip attach area disposed on a top thereof, a top pad and a bottom pad respectively disposed on the top and a bottom of the substrate base, a first top solder resist layer formed on the top of the substrate base and including a first pad opening corresponding to the top pad and covering the chip attach area, a second top solder resist layer formed on the first top solder resist layer and including a second pad opening corresponding to the top pad and a chip attach opening corresponding to the chip attach area, and a bottom solder resist layer formed on the bottom of the substrate base and including a third pad opening corresponding to the bottom pad.

19 Claims, 18 Drawing Sheets

(56) References Cited

U.S. PATENT DOCUMENTS

| | | |
|---|---|---|
| 8,248,093 B2 | 8/2012 | Han et al. |
| 8,958,211 B2* | 2/2015 | Hiroshima ............... H05K 1/18 |
| | | 174/534 |
| 9,041,205 B2* | 5/2015 | Karhade ............... H01L 23/538 |
| | | 257/690 |
| 9,355,898 B2* | 5/2016 | Kumar ............. H01L 21/76852 |
| 2007/0146980 A1 | 6/2007 | Ahn et al. |
| 2011/0057329 A1* | 3/2011 | Ushiyama ............. H01L 21/565 |
| | | 257/779 |
| 2011/0059304 A1* | 3/2011 | Ushiyama ............. H05K 3/281 |
| | | 428/213 |
| 2012/0103662 A1 | 5/2012 | Lee et al. |
| 2013/0025782 A1 | 1/2013 | Higo et al. |
| 2013/0153278 A1 | 6/2013 | Maeng |
| 2014/0069694 A1 | 3/2014 | Cho et al. |
| 2015/0053456 A1 | 2/2015 | Lee et al. |

FOREIGN PATENT DOCUMENTS

| | | |
|---|---|---|
| KR | 1020100066941 A | 6/2010 |
| KR | 1020110059436 A | 6/2011 |
| KR | 101184543 B1 | 9/2012 |
| KR | 1020120102981 A | 9/2012 |

\* cited by examiner

PRINTED CIRCUIT BOARDS AND SEMICONDUCTOR PACKAGES INCLUDING THE SAME

CROSS-REFERENCE TO RELATED APPLICATION

This application claims the benefit of Korean Patent Application No. 10-2015-0148819, filed on Oct. 26, 2015, in the Korean Intellectual Property Office, the disclosure of which is incorporated herein in its entirety by reference.

BACKGROUND

The inventive concepts relate to printed circuit boards (PCBs) and semiconductor packages including the same, and more particularly, to PCBs in which a solder resist layer is formed, and to semiconductor packages including the same.

As the electronics industry rapidly advances, the performance demands on electronic devices have increased. To meet this demand, electronic devices having higher performance and increased capacity have been developed. In particular, semiconductor packages including a plurality of stacked semiconductor chips have been developed.

To meet the increasing demands on semiconductor device performance, it is further desirable to miniaturize and lighten electronic devices.

SUMMARY

Some aspects of the inventive concepts provide PCB structures that can reduce a size of a semiconductor package including the PCB structure, and semiconductor packages including the same.

According to an aspect of the inventive concepts, there is provided a printed circuit board (PCB) including: a substrate base including a chip attach area disposed on a top surface thereof; a top pad and a bottom pad respectively disposed on the top surface and a bottom surface of the substrate base; a first top solder resist layer formed on the top surface of the substrate base, the first top solder resist layer including a first pad opening corresponding to the top pad and covering the chip attach area; a second top solder resist layer formed on the first top solder resist layer, the second top solder resist layer including a second pad opening corresponding to the top pad and a chip attach opening corresponding to the chip attach area; and a bottom solder resist layer formed on the bottom surface of the substrate base, the bottom solder resist layer including a third pad opening corresponding to the bottom pad.

A thickness of the first top solder resist layer may have a value smaller than a thickness of the second top solder resist layer.

A thickness of the bottom solder resist layer may have a value larger than a thickness of each of the first and second top solder resist layers.

The first top solder resist layer may cover a whole portion of the chip attach area of the substrate base.

A width of the second pad opening may have a value larger than a width of the first pad opening.

The top pad may be disposed in the substrate base for a top of the top pad and the top of the substrate base to have the same level, and the bottom pad may protrude from the bottom surface of the substrate base.

According to another aspect of the inventive concept, there is provided a semiconductor package including: a printed circuit board (PCB) including: a substrate base including a chip attach area disposed on a top thereof; a top pad and a bottom pad respectively disposed on the top and a bottom of the substrate base; a top solder resist layer including a first top solder resist layer including a first pad opening, corresponding to the top pad and covering the chip attach area, and a second top solder resist layer including a second pad opening corresponding to the top pad and a chip attach opening corresponding to the chip attach area, the first and second top solder resist layers being sequentially stacked on the top of the substrate base; and a bottom solder resist layer formed on the bottom of the substrate base, the bottom solder resist layer including a third pad opening corresponding to the bottom pad; a lower semiconductor chip attached to the first top solder resist layer in the chip attach area of the substrate base with a lower die attach film therebetween; an upper semiconductor chip stacked on the lower semiconductor chip; and a bonding wire configured to electrically connect the upper and lower semiconductor chips to the top pad through the first and second pad openings.

A thickness of the first top solder resist layer may have a value smaller than a thickness of the second top solder resist layer, and a thickness of the lower die attach film may have a value smaller than the thickness of the second top solder resist layer.

A bottom of the lower semiconductor chip may have a level lower than a level of a top of the second top solder resist layer with respect to a main surface of the substrate base.

The upper semiconductor chip may be stacked on the lower semiconductor chip with an upper die attach film between the PCB and the upper semiconductor chip, and the upper die attach film may surround at least a portion of the lower semiconductor chip.

The chip attach area may include a first chip attach area and a second chip attach area which are spaced apart from each other, and the lower semiconductor chip may include a first lower semiconductor chip attached to the first top solder resist layer in the first chip attach area and a second lower semiconductor chip attached to the first top solder resist layer in the second chip attach area.

The upper semiconductor chip may be stacked on the first and second lower semiconductor chips with an upper die attach film between the PCB and the upper semiconductor chip, and the upper die attach film may surround at least a portion of each of the first and second lower semiconductor chips.

The upper semiconductor chip may be stacked on the first and second lower semiconductor chips with an upper die attach film between the PCB and the upper semiconductor chip, and the upper semiconductor chip may overlap at least a portion of each of the first and second lower semiconductor chips in a direction vertical to a main surface of the PCB.

The upper die attach film covers a portion of a top of each of the first and second lower semiconductor chips that is overlapped with the upper semiconductor chip.

The second pad opening has an area wider than the first pad opening.

According to another aspect of the inventive concept, there is provided a printed circuit board (PCB) including: a substrate including a chip attach area on a top surface of the substrate; a top pad on the top surface of the substrate; a bottom pad on a bottom surface of the substrate; a first top solder resist layer on the top surface of the substrate, the first top solder resist layer including a first pad opening corresponding to the top pad, wherein the first top solder resist layer is on the chip attach area; a second top solder resist layer on the first top solder resist layer, the second top solder resist layer including a second pad opening corresponding to the top pad and a chip attach opening corresponding to the chip attach area, wherein an area of the second pad opening is greater than an area of the first pad opening; and a bottom solder resist layer on the bottom surface of the substrate, the bottom solder resist layer including a third pad opening corresponding to the bottom pad. The top pad may be electrically connected to the bottom pad.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

As used herein, the term "and/or" includes any and all combinations of one or more of the associated listed items. Expressions such as "at least one of" when preceding a list of elements, modify the entire list of elements and do not modify the individual elements of the list.

Embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. It should be noted that elements shown in the accompanying drawings may be scaled up or down for convenience in description. The dimensions of respective elements may be exaggerated or reduced.

It will also be understood that when an element is referred to as being 'on' another element, it can be directly on the other element, or intervening elements may also be present. Further, it will be understood that when an element is referred to as being 'under' another element, it can be directly under, and one or more intervening elements may also be present. In addition, it will also be understood that when an element is referred to as being 'between' two elements, it can be the only element between the two elements, or one or more intervening elements may also be present. Other terms for describing a relationship between elements, for example, "between" and "directly between" may be understood likewise.

Terms like a first and a second may be used to describe various elements, but the elements should not be limited by the terms. The terms may be used only as object for distinguishing an element from another element. For example, without departing from the spirit and scope of the inventive concept, a first element may be referred to as a second element, and similarly, the second element may be referred to as the first element.

In the following description, the technical terms are used only for explain a specific embodiment while not limiting the present embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Unless terms used in embodiments of the inventive concept are defined differently, the terms may be construed as meaning known to those skilled in the art.

Hereinafter, embodiments will be described in detail with reference to the accompanying drawings. Like numbers refer to like elements throughout this description.

Figure 1A:
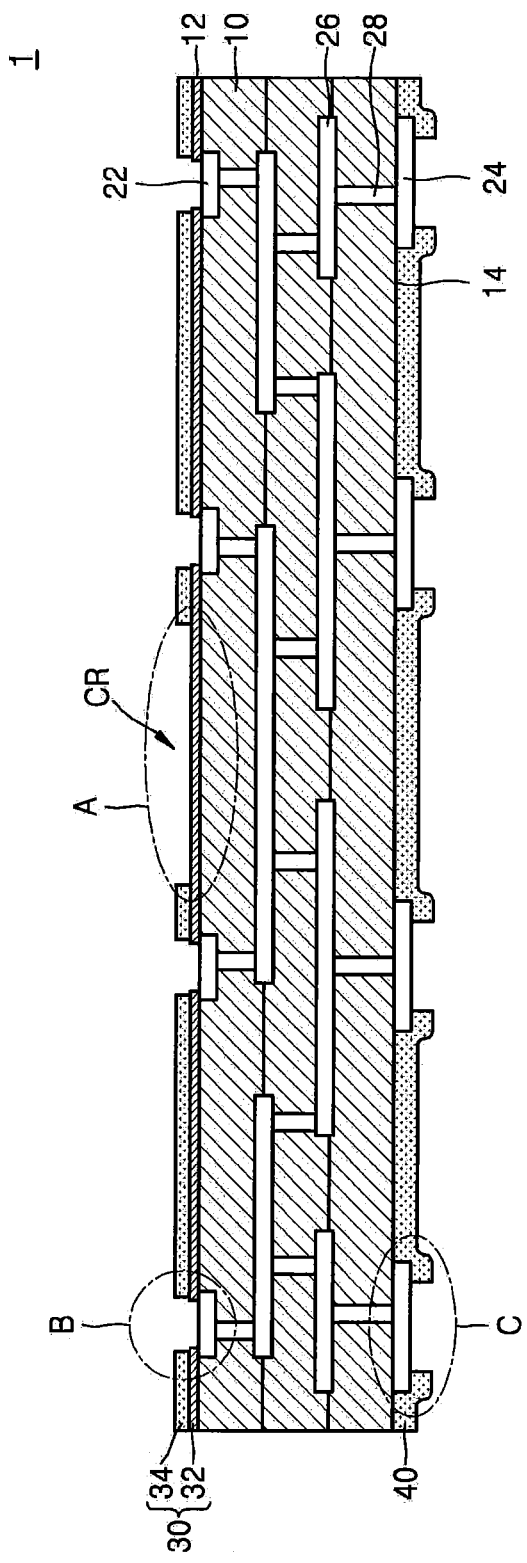
FIGS. 1A to 1D are cross-sectional views and partially enlarged views illustrating a PCB according to an embodiment.
Figure 1B:
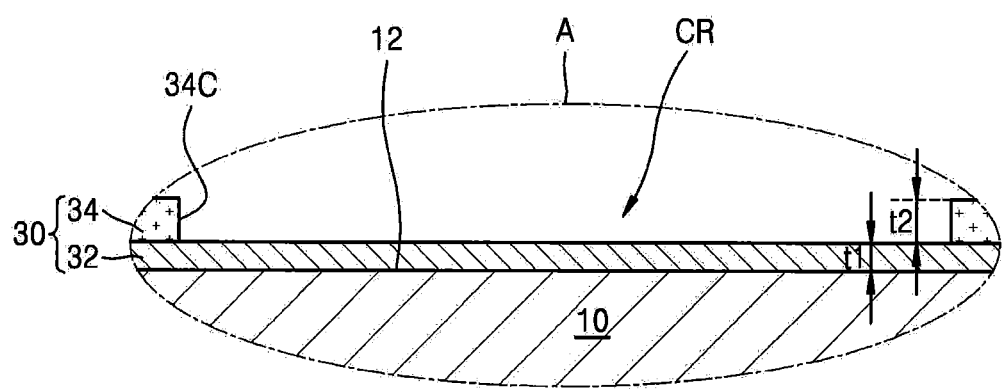
Figure 1C:
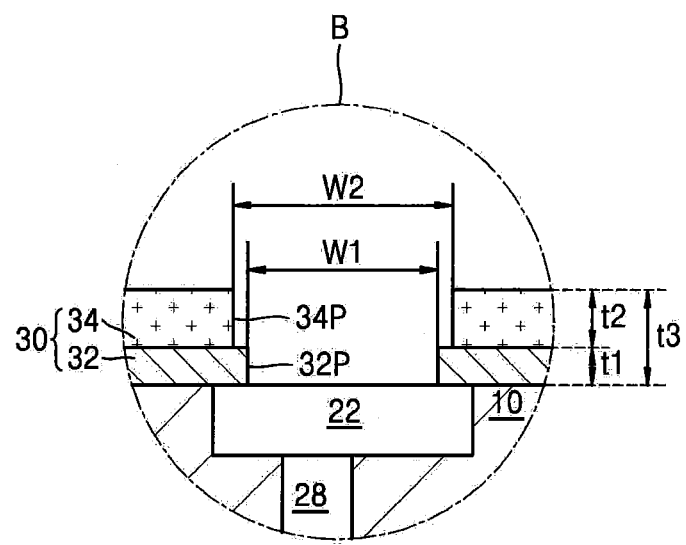
Figure 1D:
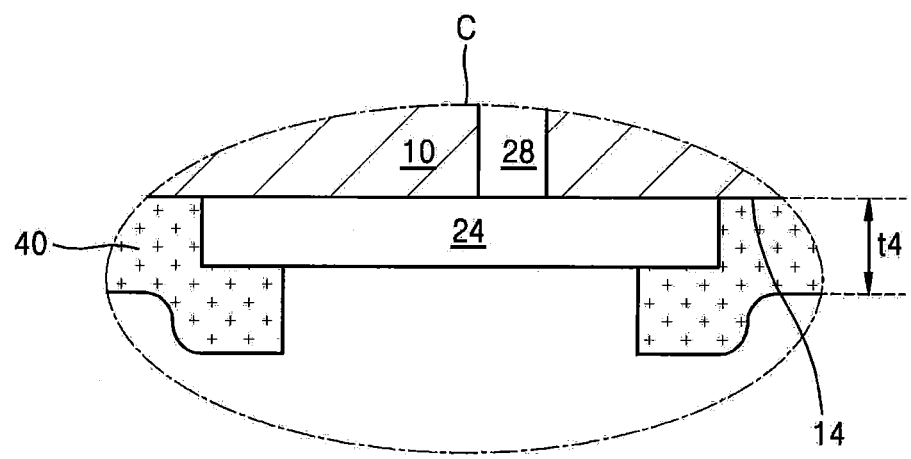

FIGS. 1A to 1D are cross-sectional views and partially enlarged views illustrating a PCB 1 according to some embodiments. In detail, FIGS. 1B, 1C and 1D are partially enlarged views of a portion A, a portion B, and a portion C of FIG. 1A.

Referring to FIGS. 1A to 1D, the PCB 1 may include a substrate base 10, a top pad 22 disposed on a top surface 12 of the substrate base 10, and a top solder resist layer 30 formed on the top surface 12 of the substrate base 10.

The substrate base 10 may be formed of at least one of a phenol resin, epoxy resin, and polyimide. For example, the substrate base 10 may include flame retardant 4 (FR4), tetrafunctional epoxy, polyphenylene ether, epoxy/polyphenylene oxide, bismaleimide triazine (BT), thermount, cyanate ester, polyimide, and/or liquid crystal polymer.

The substrate base 10 may include a plurality of base layers which are stacked thereon. The substrate base 10 may include a chip attach area CR where a semiconductor chip may be attached to the top surface 12.

The top pad 22 may be formed of copper, nickel, stainless steel, beryllium copper, and/or the like. The top pad 22 may be a portion of a conductive pattern disposed on the top surface 12 of the substrate base 10 that is exposed by the top solder resist layer 30.

For example, the top pad 22 may include a portion of the conductive pattern formed by a process in which a portion of a copper foil is removed from a surface and patterned, the substrate base 10 is laminated on the copper foil in order for the patterned portion to be buried in the substrate base 10, and a portion of the copper foil other than the patterned portion is removed. The top pad 22 may further include a metal layer (not shown) which is formed on the conductive pattern formed of a copper foil. The metal layer may be formed for enhancing an adhesive force of the top pad 22 and/or for reducing a contact resistance of the top pad 22. For example, the metal layer may be formed through a process such as hot air solder levelling (H.A.S.L.), Ni/Au plating, or the like.

The top pad 22 may be inlaid into the substrate base 10 to form an embedded traces structure (ETS). For example, the top pad 22 may be disposed in the substrate base 10 such that a top surface of the top pad 22 and the top surface 12 of the substrate base 10 have the same level.

An internal conductive layer 26 and a conductive via 28 which are electrically connected to the top pad 22 may be formed in the substrate base 10. In FIG. 1A, the top pad 22 is illustrated as being directly connected to the conductive via 28, but some embodiments of the inventive concepts are not limited thereto. In other embodiments, the top pad 22 and the conductive via 28 may be connected to the conductive via 28 through a portion of the conductive pattern which extends along the top surface 12 of the substrate base 10. In some embodiments, the portion of the conductive pattern which extends along the top surface 12 of the substrate base 10 may connect at least two the top pads 22. The internal conductive layer 26 and/or the conductive via 28 may be formed of copper, nickel, stainless steel, beryllium copper, and/or the like.

The top solder resist layer 30 may include a first top solder resist layer 32 and a second top solder resist layer 34.

The first top solder resist layer 32 and the second top solder resist layer 34 may each be formed by, for example, a process in which a solder mask insulating layer is coated onto the top surface 12 of the base substrate 10 by a screen printing process or an inkjet printing process and then is hardened through the application of heat, ultraviolet (UV), or infrared rays (IR).

The first top solder resist layer 32 and the second top solder resist layer 34 may each be formed by, for example, a process where a photo-imageable solder resist is coated on the whole top surface 12 of the base substrate 10 by the screen printing process or a spray coating process or a film-type solder resist material is adhered to the top surface 12 by a laminating process, an undesired portion is removed by an exposure and development process, and a hardening process is performed by applying heat, UV, or IR energy.

The first top solder resist layer 32 may include a first pad opening 32P corresponding to the top pad 22 and may cover a chip attach area CR of the substrate base 10. The top pad 22 may be a portion of the conductive pattern disposed on the top surface 12 of the substrate base 10 that is exposed by the first pad opening 32P. The first top solder resist layer 32 may cover the entire chip attach area CR of the substrate base 10.

The second top solder resist layer 34 may be formed on the first top solder resist layer 32 and may include a second pad opening 34P corresponding to the top pad 22 and a chip attach opening 34C corresponding to the chip attach area CR.

A first thickness t1 of the first top solder resist layer 32 may have a value smaller than a second thickness t2 of the second top solder resist layer 34. That is, the second top solder resist layer 34 may be thicker than the first top solder resist layer 32. In some particular embodiments, the second thickness t2 may have, for example, a value which is 1.5 times larger than the first thickness t1, but some embodiments of the inventive concepts are not limited thereto. The second top solder resist layer 34 may include the chip attach opening 34C so that only the first top solder resist layer 32 is formed in the chip attach area CR of the substrate base 10. That is, the second top solder resist layer 34 may not be formed in the chip attach area CR.

A third thickness t3 corresponds to a thickness of a portion where the first and second top solder resist layers 32 and 34 are both formed in the top solder resist layer 30. The third thickness t3 may be a sum of the first thickness t1 and the second thickness t2.

A semiconductor chip may be attached to the PCB 1 in the chip attach area CR of the PCB 1. In particular, the semiconductor chip may be attached to the first top solder resist layer 32 through the chip attach opening 34C of the second top solder resist layer 34 in the chip attach area CR. Therefore, a top of a semiconductor chip which is attached to the PCB 1 through the chip attach opening 34C of the second top solder resist layer 34 may have a level that is lower relative to the top surface 12 of the substrate base 10 by the second thickness t2 than a level of a top of a semiconductor chip attached to a PCB that has no chip attach opening in the second top solder resist layer 34. Accordingly, a PCB 1 according to some embodiments may enable a thickness of a semiconductor package including the PCB 1 to be relatively thin.

Moreover, since the semiconductor chip is attached to the first top solder resist layer 32 through the chip attach opening 34C without directly contacting the substrate base 10, an adhesive force between the semiconductor chip and the PCB 1 may be enhanced. Also, a portion of the conductive pattern which extends through the top surface 12 of the substrate 10 under the semiconductor chip may be electrically insulated from the semiconductor chip by the first top solder resist layer 32, and thus, the configuration of the conductive pattern may be designed freely without being concerned with the location of the semiconductor chip.

A first width W1 of the first pad opening 32P, may be smaller than a second width W2 of the second pad opening 34P. Because the second width W2 of the second pad opening 34P is larger than the first width W1 of the first pad opening 32P, the second pad opening 34P may expose a boundary of the first top solder resist layer 32 that defines the first pad opening 32P.

In the pad openings 32P and 34P of the top solder resist layer 30 corresponding to the top pad 22, a portion far away from the top pad 22 (i.e., the second pad opening 34P) may have an area that is greater than that of a portion close to the top pad 22. (i.e., the first pad opening 32P) Therefore, a loop of a bonding wire which is to be connected to the top pad 22 can be more easily formed.

The PCB 1 may further include a bottom pad 24 disposed on a bottom surface 14 of the substrate base 10 and a bottom solder resist layer 40 formed on the bottom surface 14 of the substrate base 10.

The bottom pad 24 may be formed of copper, nickel, stainless steel, beryllium copper, and/or the like. For example, the bottom pad 24 may be a portion of a conductive pattern that is formed by patterning a copper foil coated on the bottom surface 14 of the substrate base 10. For example, the bottom pad 24 may be a portion of the conductive pattern exposed by the bottom solder resist layer 40. The bottom pad 24 may further include a metal layer (not shown) formed on the conductive pattern formed of the copper foil. The metal layer may be formed for enhancing an adhesive force of the bottom pad 24 and/or for reducing a contact resistance thereof. For example, the metal layer may be formed through a process, such as hot air solder levelling (H.A.S.L.), Ni/Au plating, or the like.

The bottom pad 24 may protrude from the bottom surface 14 of the substrate base 10. In FIG. 1A, the bottom pad 24 is illustrated as being directly connected to the conductive via 28, but some embodiments of the inventive concepts are not limited thereto. In other embodiments, the bottom pad 24 and the conductive via 28 may be connected to the conductive via 28 through a portion of the conductive pattern which extends along the bottom surface 14 of the substrate base 10. In some embodiments, the portion of the conductive pattern which extends along the bottom surface 14 of the substrate base 10 may connect at least two the bottom pads 24.

The bottom solder resist layer 40 may be formed by, for example, a process where a solder mask insulating layer is coated on the bottom surface 14 of the base substrate 10 by the screen printing process or the inkjet printing process and then is hardened by application of heat, UV, or IR energy.

The bottom solder resist layer 40 may be formed, for example, using a process in which a photo-imageable solder resist is coated on the bottom surface 14 of the base substrate 10 by a screen printing process or a spray coating process, or in which a film-type solder resist material is adhered to the bottom surface 14 by a laminating process, an undesired portion is removed by an exposure and development process, and a hardening process is performed using heat, UV, or IR energy.

A fourth thickness t4 is a thickness of the bottom solder resist layer 40 and may be larger than each of the first thickness t1 of the first top solder resist layer 32 and the second thickness t2 of the second top solder resist layer 34.

The fourth thickness t4 of the bottom solder resist layer 40 and the third thickness t3 of the top solder resist layer 30 may have the same value or a similar value, but some embodiments of the inventive concepts are not limited thereto. In other embodiments, each of the fourth thickness t4 and the third thickness t3 may be several tens of microns thick.

Figure 2A:
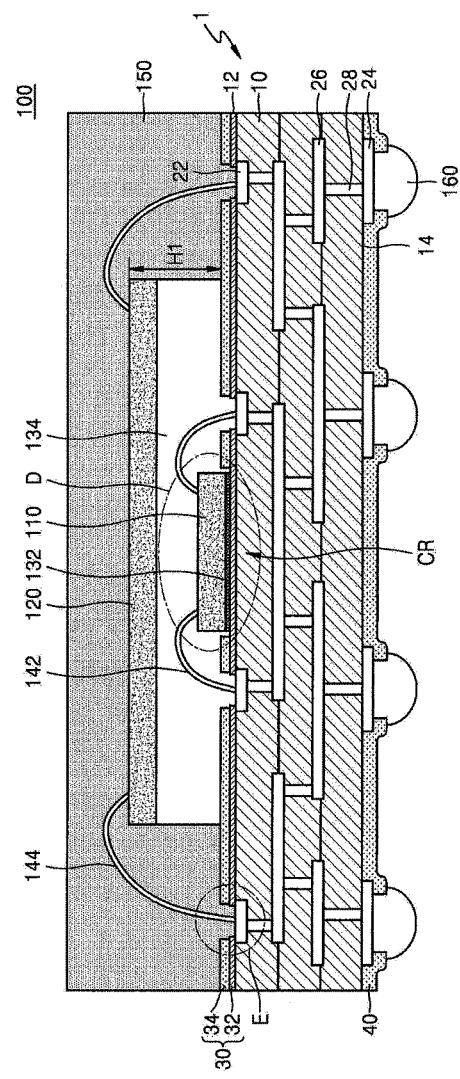
FIGS. 2A to 2C are cross-sectional views and partially enlarged views illustrating a semiconductor package according to an embodiment.
Figure 2B:
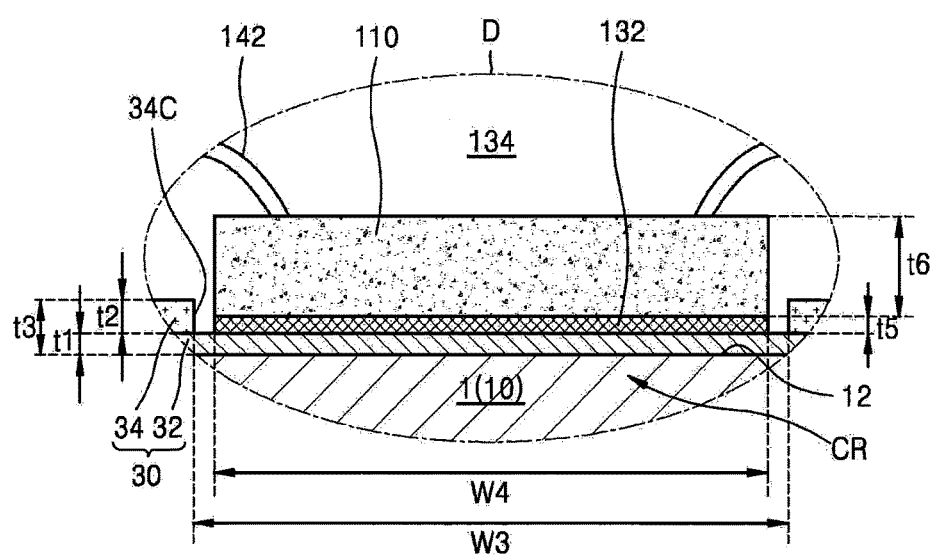
Figure 2C:
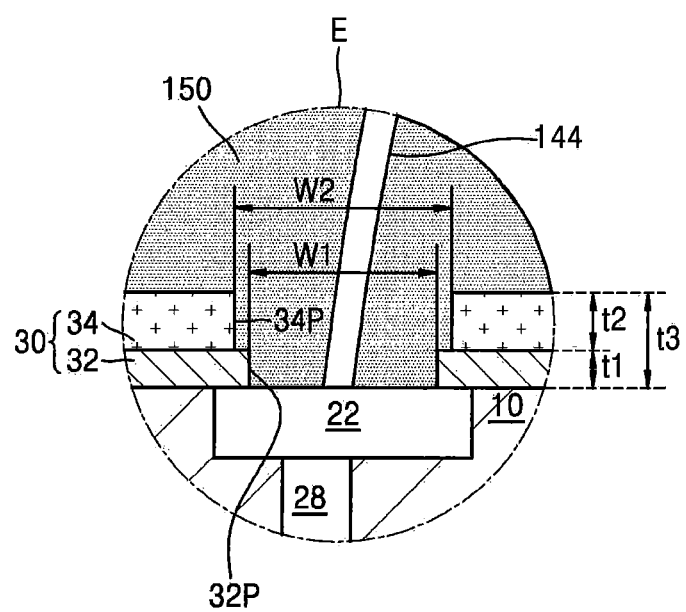

FIGS. 2A to 2C are cross-sectional views and partially enlarged views illustrating a semiconductor package 100 according to some embodiments. In detail, FIG. 2B is a partially enlarged view of a portion D of FIG. 2A, and FIG. 2C is a partially enlarged view of a portion E of FIG. 2A. In describing FIGS. 2A and 2B, details repetitive of FIGS. 1A to 1D may be omitted.

Referring to FIGS. 2A to 2C, the semiconductor package 100 may include a PCB 1 and a plurality of semiconductor chips 110 and 120 attached to the PCB 1. The semiconductor chips 110 and 120 may a lower semiconductor chip 110 and an upper semiconductor chip 120.

The PCB 1 may include a substrate base 10, a top pad 22 disposed on a top surface 12 of the substrate base 10, and a top solder resist layer 30 formed on the top surface 12 of the substrate base 10. The substrate base 10 may include a plurality of base layers which are stacked thereon. The substrate base 10 may include a chip attach area CR where the lower semiconductor chip 110 is attached to the top surface 12.

The top pad 22 may have a shape that is inlaid into the substrate base 10 to have an ETS. For example, the top pad 22 may be disposed in the substrate base 10 so that a top of the top pad 22 and the top surface 12 of the substrate base 10 have the same level. An internal conductive layer 26 and a conductive via 28 which are electrically connected to the top pad 22 may be formed in the substrate base 10.

The top solder resist layer 30 may include a first top solder resist layer 32 and a second top solder resist layer 34.

The first top solder resist layer 32 may include a first pad opening 32P corresponding to the top pad 22 and may cover a chip attach area CR of the substrate base 10. The top pad 22 may be a portion of a conductive pattern disposed on the top surface 12 of the substrate base 10 that is exposed by the first pad opening 32P. The first top solder resist layer 32 may cover the entire chip attach area CR of the substrate base 10.

The second top solder resist layer 34 may include a second pad opening 34P corresponding to the top pad 22 and a chip attach opening 34C corresponding to the chip attach area CR, and may be formed on the first top solder resist layer 32.

A first thickness t1 of the first top solder resist layer 32 may be smaller than a second thickness t2 of the second top solder resist layer 34. The second top solder resist layer 34 may include the chip attach opening 34C so that only the first top solder resist layer 32 is formed in the chip attach area CR of the substrate base 10 and the second top solder resist layer 34 is not formed in the chip attach area CR.

A third thickness t3 of a portion where the first and second top solder resist layers 32 and 34 are both formed in the top solder resist layer 30 may be equal to a sum of the first thickness t1 and the second thickness t2.

The lower semiconductor chip 110 may be attached to the chip attach area CR of the PCB 1. In particular, the lower semiconductor chip 110 may be attached to the chip attach area CR of the PCB 1 with a lower die attach film 132 therebetween. Therefore, the lower semiconductor chip 110 may be attached to the first top solder resist layer 32 through the chip attach opening 34C of the second top solder resist layer 34. That is, the lower semiconductor chip 110 may be attached to the first top solder resist layer 32 formed in the chip attach area CR of the PCB 1 with the lower die attach film 132 therebetween.

A fifth thickness t5 of the lower die attach film 132 may be smaller than the second thickness t2. Therefore, a bottom of the lower semiconductor chip 110 may have a level lower than a top of the second top solder resist layer 34 with respect to a main surface of the substrate base 10. Accordingly, a top of the lower semiconductor chip 110 may protrude from a top of the second top solder resist layer 34 by a distance equal to "t5+t6−t2" which is obtained by subtracting the second thickness t2, which is a thickness of the second top solder resist layer 34, from a sum of a fifth thickness t6, which is a thickness of the lower semiconductor chip 110, and the fifth thickness t5 which is a thickness of the lower die attach film 132.

Therefore, a top of the lower semiconductor chip 110 which is attached to the PCB 1 through the chip attach opening 34C of the second top solder resist layer 34 may have a level that is lower by the second thickness t2 than the level of a top of a semiconductor chip attached to a PCB that has no chip attach opening with respect to a main surface of the substrate base 10.

The lower semiconductor chip 110 may be electrically connected to the PCB 1 by a lower bonding wire 142. The lower bonding wire 142 may connect the top pad 22 to a bonding pad (not shown) formed on a top of the lower semiconductor chip 110.

The upper semiconductor chip 120 may be stacked on the lower semiconductor chip 110. In particular, the upper semiconductor chip 120 may be stacked on the lower semiconductor chip 110 with the upper die attach film 134 between the PCB 1 and the upper semiconductor chip 120. The upper semiconductor chip 120 may be electrically connected to the PCB 1 by the upper bonding wire 144. The upper bonding wire 144 may connect the top pad 22 to a bonding pad (not shown) formed on a top of the upper semiconductor chip 120.

A first width W1 of the first pad opening 32P may be smaller than a second width W2 of the second pad opening 34P. Therefore, since the second width W2 of the second pad opening 34P has a value larger than that of the first width W1 of the first pad opening 32P, the second pad opening 34P may expose a boundary of the first top solder resist layer 32 that defines the first pad opening 32P.

In the pad openings 32P and 34P of the top solder resist layer 30 corresponding to the top pad 22, a portion far away from the top pad 22 (i.e., the second pad opening 34P) may have an area wider than that of a portion close to the top pad 22 (i.e., the first pad opening 32P). Therefore, since the lower and upper bonding wires 142 and 144 are connected to the top pad 22 through the first and second pad openings 32P and 34P, a loop of each of the lower and upper bonding wires 142 and 144 connected to the top pad 22 may be easily formed.

The upper die attach film 134 may surround at least a portion of the lower semiconductor chip 110. In some embodiments, the upper die attach film 134 may surround all portions of the lower semiconductor chip 110 except for a portion contacting the PCB 1. The upper die attach film 134 may surround the lower bonding wire 142. In some embodiments, the lower semiconductor chip 110 and the lower bonding wire 142 may be buried in the upper die attach film 134.

The upper die attach film 134 may be obtained in an operation of manufacturing the semiconductor package 100 by hardening a multi-film having a B-stage state to a C-stage state. Here, the B-stage state is a state in which a solvent is removed in an A-stage state corresponding to an initial reaction stage of a thermosetting resin, but a hardening process is not performed. That is, it denotes a state in which a material swells in a solvent without being melted but is not dissolved. Therefore, the A-stage state may be changed to a B-stage state through heat treatment. The B-stage state may have adhesiveness. The C-stage state denotes a state where a material is completely hardened.

The multi-film having the B-stage state may have a multi-layer structure which includes a first layer contacting a bottom of the upper semiconductor chip 120 and a second layer contacting the first layer.

The first layer and the second layer may each include a binder component and a hardening component. A weight average molecular weight of the binder component of the first layer may be greater than that of the binder component of the second layer. The weight average molecular weight of the binder component of the first layer may be, for example, one hundred thousand to two millions. The weight average molecular weight of the binder component of the first layer may be, for example, hundred to five thousands. The weight average molecular weight of the binder component of the first layer may be 20 to 1,000 times greater than that of the binder component of the second layer.

The binder component of the first layer may include a first binder material and a second binder material. The second binder material may be less in weight average molecular weight than the first binder material. The binder component of the second layer may include a material which is the same as or similar to the second binder material. That is, the binder component of the second layer may include only the second binder material which is relatively less in weight average molecular weight, and the binder component of the first layer may be produced by a combination of the second binder material, which is relatively less in weight average molecular weight, and the first binder material which is relatively greater in weight average molecular weight.

The first binder material may be, for example, an acryl-based polymer resin. The second binder material may be, for example, an epoxy resin. The binder component of the first layer may be produced by a combination of an acryl-based polymer resin and an epoxy resin. The binder component of the second layer may be, for example, an epoxy resin.

A hardening component of each of the first layer and the second layer may include, for example, an epoxy resin, a phenol-based hardening resin, or a phenoxy resin. The hardening component of each of the first layer and the second layer may perform a function of a binder component. For example, since the first layer is formed by a combination of an acryl-based polymer resin and an epoxy resin, the epoxy resin may perform a function of the hardening component with respect to the acryl-based polymer resin. Since the second layer is formed of an epoxy resin, the epoxy resin may simultaneously perform a function of the binder component and a function of the hardening component.

Each of the first layer and the second layer may further include a filler and an additive, such as a silane coupling agent or a hardening catalyst. The hardening catalyst may be, for example, a phosphine-based, imidazole-based, or amine-based hardening catalyst. The silane coupling agent may be, for example, a mercapto silane coupling agent or an epoxy silane coupling agent. The filler may be, for example, silica.

The second layer may be higher in flowability or lower in viscosity than the first layer. Also, since the second layer is formed of a material which is relatively lower in weight average molecular weight than the first layer, the second layer may be easily deformed by low pressure.

The first layer may be thinner than the second layer. For example, the first layer may have a thickness of about 1 μm to about 20 μm, and the second layer may have a thickness of about 30 μm to about 100 μm. The first layer may be formed as thin as possible under a condition in which the second layer, which has relatively high flowability and viscosity, is capable of being fixed.

When the upper semiconductor chip 120 is stacked on the lower semiconductor chip 110, portions of the second layer may surround the lower semiconductor chip 110 because the second layer is relatively less in weight average molecular weight. Also, the second layer may be formed to have a thickness thicker than a sum of thicknesses of the lower semiconductor chip 110 and the lower die attach film 132, and thus may contact the PCB 1.

The first layer may have, for example, a characteristic which is the same as or similar to that of an auxiliary film for forming the lower die attach film 132. The lower die attach film 132 may be obtained by hardening the auxiliary film to the C-stage state in an operation of manufacturing the semiconductor package 100.

In the lower semiconductor chip 110 and the upper semiconductor chip 120, a semiconductor device may be formed on an active surface, namely, an opposite surface facing the PCB 1. The lower semiconductor chip 110 and the upper semiconductor chip 120 may each include, for example, silicon (Si). Alternatively, the lower semiconductor chip 110 and the upper semiconductor chip 120 may each include a semiconductor element, such as germanium (Ge), or a compound semiconductor such as silicon carbide (SiC), gallium arsenide (GaAs), indium arsenide (InAs), or indium phosphide (InP). Alternatively, the lower semiconductor chip 110 and the upper semiconductor chip 120 may each have a silicon-on insulator (SOI) structure. For example, the lower semiconductor chip 110 and the upper semiconductor chip 120 may each include a buried oxide layer (BOX). The lower semiconductor chip 110 and the upper semiconductor chip 120 may each include a conductive area, for example, a well on which impurities are doped, or a structure on which impurities are doped. Also, the lower semiconductor chip 110 and the upper semiconductor chip 120 may each have various device isolation structures such as a shallow trench isolation structure.

The semiconductor device may include a system large scale integration (LSI), a dynamic random access memory (DRAM), a static random access memory (SRAM), an electrically erasable programmable read-only memory (EEPROM), a phase-change random access memory (PRAM), a magneto-resistive random access memory (MRAM), or a resistive random access memory (RRAM). In detail, the semiconductor device may include various kinds of individual devices. The individual devices may include various microelectronic devices, for example, a metal-oxide-semiconductor field effect transistor (MOSFET) such as a complementary metal-insulator-semiconductor (CMOS) transistor, a system LSI, an imaging sensor such as a CMOS imaging sensor (CIS), a micro-electro-mechanical system (MEMS), an active device, and a passive device. The individual devices may be electrically connected to the conductive area. The semiconductor device may further include at least two of the individual devices or a conductive plug or a conductive wiring which electrically connects the individual devices to the conductive area. Also, the individual devices may be electrically disconnected from other individual devices adjacent thereto by insulation layers, respectively.

The semiconductor device may include a plurality of wiring structures for connecting the individual devices to other wirings. The plurality of wiring structures may include a metal wiring layer and a via plug. The metal wiring layer and the via plug may include a wiring barrier layer and a wiring metal layer. The wiring barrier layer may include at least one material selected from among titanium (Ti), TiN, tantalum (Ta), and TaN. The wiring metal layer may include at least one material selected from among tungsten (W), aluminum (Al), and copper (Cu). The metal wiring layer and the via plug may be formed of the same material. Alternatively, at least a portion of the metal wiring layer and at least a portion of the via plug may be formed of different materials. A plurality of the metal wiring layers and/or via plugs may form a multi-layer structure. That is, the wiring structure may be a multi-layer structure where two or more the metal wiring layers or two or more the via plugs are alternately stacked.

The lower semiconductor chip 110 and the upper semiconductor chip 120 may each include a bonding pad (not shown) that is electrically connected to the semiconductor device. The bonding pad may be, for example, a portion of one of the metal wiring layers configuring the multi-layer structure.

In some embodiments, the lower semiconductor chip 110 may be a controller chip, an auxiliary memory chip, and/or a dummy chip, and the upper semiconductor chip 120 may be a nonvolatile memory chip.

The nonvolatile memory chip may be, for example, a NAND flash memory, a RRAM, an MRAM, a PRAM, or a ferroelectric RAM (FRAM). The nonvolatile memory chip may be a semiconductor package which includes one nonvolatile memory chip or a plurality of stacked nonvolatile memory chips.

The controller chip may provide an interface and/or a protocol between the host and the nonvolatile memory chip. The controller chip may provide a standard protocol such as parallel-ATA (PATA), serial-ATA (SATA), small computer system interface (SCSI), or peripheral component interconnection express (PIC-E), for interfacing between the nonvolatile memory chip and the host. Alternatively, the controller chip may perform wear levelling, garbage collection, bad block management, and error correcting code (ECC) for the nonvolatile memory chip.

The auxiliary memory chip may be, for example, a nonvolatile memory chip such as a DRAM. The auxiliary memory chip may provide a cache to scale the access time and data transfer performance of the nonvolatile memory chip.

When the lower semiconductor chip 110 is configured with semiconductor chips, having different areas, such as the controller chip and the auxiliary memory chip, spaces occupied by a plurality of the lower semiconductor chips 110 under the upper semiconductor chip 120 may differ depending on the relative mounting positions of the chips. A dummy chip may be used for solving a problem where the upper semiconductor chip 120 is not horizontal or the upper semiconductor chip 120 is partially bent. The dummy chip may be configured with a semiconductor substrate. The dummy chip may be disposed between the PCB 1 and the upper semiconductor chip 120 without being connected to the lower bonding wire 142.

The PCB 1 may further include a bottom pad 24 disposed on a bottom surface 14 of the substrate base 10 and a bottom solder resist layer 40 formed on the bottom surface 14 of the substrate base 10. The bottom pad 24 may have a shape which protrudes from the substrate base 10.

The semiconductor package 100 may further include an external connection member 160 attached to a bottom of the PCB 1. The external connection member 160 may be, for example, a solder ball. The external connection member 160 may be formed on the bottom pad 24. The semiconductor package 100 may be electrically connected to an external system by the external connection member 160.

A mold layer 150 may be formed on a top of the PCB 1. The mold layer 150 may be formed on the top of the PCB 1 to surround the lower semiconductor chip 110, the upper semiconductor chip 120, and the bonding wires 142 and 144. The mold layer 150 may be formed of a resin. The mold layer 150 may be formed of, for example, an epoxy mold compound (EMC).

In a semiconductor package 100 according to some embodiments, a portion of the lower semiconductor chip 110 and the lower die attach film 132 may be disposed in the chip attach opening 34C, and thus, a height from a top of the top solder resist layer 30 to a top of the lower semiconductor chip 110 may be reduced. Therefore, a height H1 from the top of the top solder resist layer 30 to the top of the upper semiconductor chip 120 may be reduced. For example, a top of the upper semiconductor chip 120 which is attached to the PCB 1 through a chip attach opening 34C of the second top solder resist layer 34 may have a level that is lower with respect to a main surface of the substrate base 10 by a second thickness t2 than that of a top of an upper semiconductor chip attached to a PCB having no chip attach opening. A semiconductor package 100 according to some embodiments may be implemented to have a relatively thin thickness, and thus, a size of a semiconductor package may be reduced without any reduction in performance.

Moreover, since the lower semiconductor chip 110 is attached to the first top solder resist layer 32 through the chip attach opening 34C without directly contacting the substrate base 10, an adhesive force between the lower semiconductor chip 110 and the PCB 1 may be enhanced. Also, a portion of the conductive pattern which extends through the top surface 12 of the substrate base 10 under the lower semiconductor chip 110 may be electrically insulated from the lower semiconductor chip 110 by the first top solder resist layer 32, and thus, the conductive pattern may be more easily designed.

Figure 3:
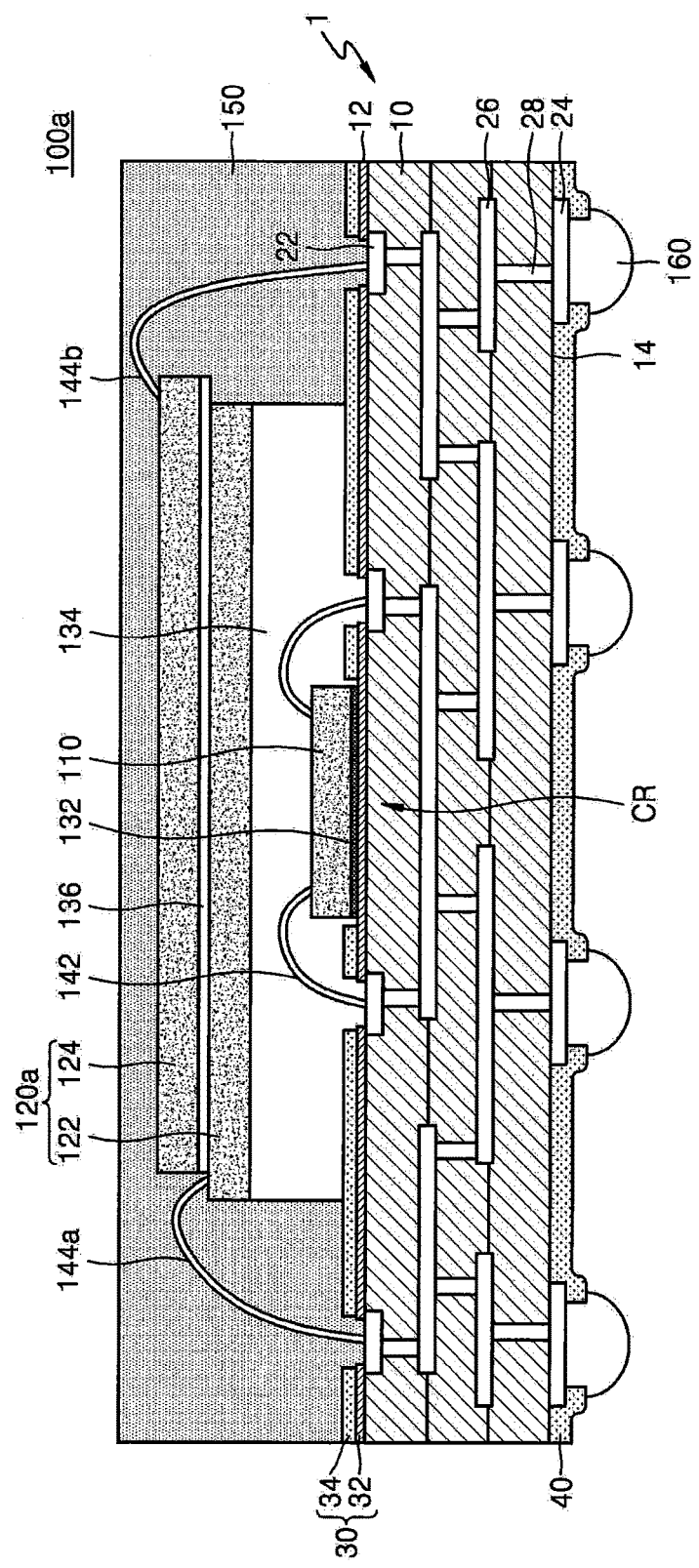
FIG. 3 is a cross-sectional view illustrating a semiconductor package according to an embodiment.

FIG. 3 is a cross-sectional view illustrating a semiconductor package according to further embodiments. In describing FIG. 3, details repetitive of FIGS. 1A to 2C may be omitted.

Referring to FIG. 3, the semiconductor package 100a may include a PCB 1 and a plurality of semiconductor chips 110 and 120a attached to the PCB 1. The semiconductor chips 110 and 120a may a lower semiconductor chip 110 and an upper semiconductor chip 120a.

The PCB 1 may include a substrate base 10, a top pad 22 disposed on a top surface 12 of the substrate base 10, and a top solder resist layer 30 formed on the top surface 12 of the substrate base 10. The substrate base 10 may include a plurality of base layers which are stacked thereon. The substrate base 10 may include a chip attach area CR where the lower semiconductor chip 110 is attached to the top surface 12. The PCB 1 may further include a bottom pad 24 disposed on a bottom surface 14 of the substrate base 10 and a bottom solder resist layer 40 formed on the bottom surface 14 of the substrate base 10. The semiconductor package 100 may further include an external connection member 160 attached to a bottom of the PCB 1.

The top solder resist layer 30 may include a first top solder resist layer 32 and a second top solder resist layer 34.

The first top solder resist layer 32 may include a first pad opening 32P corresponding to the top pad 22 and may cover a chip attach area CR of the substrate base 10. The top pad 22 may be a portion of a conductive pattern disposed on the top surface 12 of the substrate base 10 that is exposed by the first pad opening 32P. The first top solder resist layer 32 may cover the entire chip attach area CR of the substrate base 10.

The second top solder resist layer 34 may include a second pad opening (34P of FIG. 1C) corresponding to the top pad 22 and a chip attach opening (34C of FIG. 1B) corresponding to the chip attach area CR, and may be formed on the first top solder resist layer 32. The second top solder resist layer 34 may include the chip attach opening 34C so that only the first top solder resist layer 32 is formed in the chip attach area CR of the substrate base 10 and the second top solder resist layer 34 is not formed in the chip attach area CR.

A lower semiconductor chip 110 may be attached to the chip attach area CR of the PCB 1. The lower semiconductor chip 110 may be attached to the chip attach area CR of the PCB 1 with a lower die attach film 132 therebetween. Therefore, the lower semiconductor chip 110 may be attached to the first top solder resist layer 32 through the chip attach opening 34C of the second top solder resist layer 34 in the chip attach area CR of the PCB 1.

Therefore, a top of the lower semiconductor chip 110 which is attached to the PCB 1 through the chip attach opening 34C of the second top solder resist layer 34 may have a level that is lower with respect to a main surface of the substrate base 10 by a thickness of the second top solder resist layer 34 (t2 of FIG. 1B) than a level of a top of a semiconductor chip attached to a PCB having no chip attach opening.

The lower semiconductor chip 110 may be electrically connected to the PCB 1 by a lower bonding wire 142. The upper semiconductor chip 120a may be stacked on the lower semiconductor chip 110. The upper semiconductor chip 120a may be stacked on the lower semiconductor chip 110 with the upper die attach film 134 between the PCB 1 and the upper semiconductor chip 120a. The upper semiconductor chip 120a may be electrically connected to the PCB 1 by a plurality of upper bonding wires 144a and 144b.

The upper semiconductor chip 120a may include first and second upper semiconductor chips 122 and 124 which are stacked. The second upper semiconductor chip 124 may be stacked on the first upper semiconductor chip 122 with a die attach film 136 therebetween. In FIG. 3, the upper semiconductor chip 120a is illustrated as including two semiconductor chips (i.e., the first and second semiconductor chips 122 and 124) which are stacked, but some embodiments of the inventive concepts are not limited thereto. For example, the upper semiconductor chip 120a may include three or more semiconductor chips which are stacked.

In the pad openings 32P and 34P of the top solder resist layer 30 corresponding to the top pad 22, a portion far away from the top pad 22 (i.e., the second pad opening 34P) may have an area that is wider than that of a portion close to the top pad 22 (i.e., the first pad opening 32P). Therefore, a loop of each of the lower bonding wire 142 and the upper bonding wires 144a and 144b connected to the top pad 22 may be more easily formed.

A mold layer 150 may be formed on a top of the PCB 1. The mold layer 150 may be formed on the top of the PCB 1 to surround the lower semiconductor chip 110, the upper semiconductor chip 120a, and the bonding wires 142, 144a and 144b.

In a semiconductor package 100a according to some embodiments, since a portion of the lower semiconductor chip 110 and the lower die attach film 132 are disposed in the chip attach opening 34C, a height from a top of the top solder resist layer 30 to a top of the lower semiconductor chip 110 may be reduced, and thus, a height from the top the top solder resist layer 30 to an uppermost end of the upper semiconductor chip 120a may also be reduced.

Therefore, the semiconductor package 100a according to some embodiments may include the upper semiconductor chip including a plurality of stacked semiconductor chips and may have a relatively small thickness.

Figure 4:
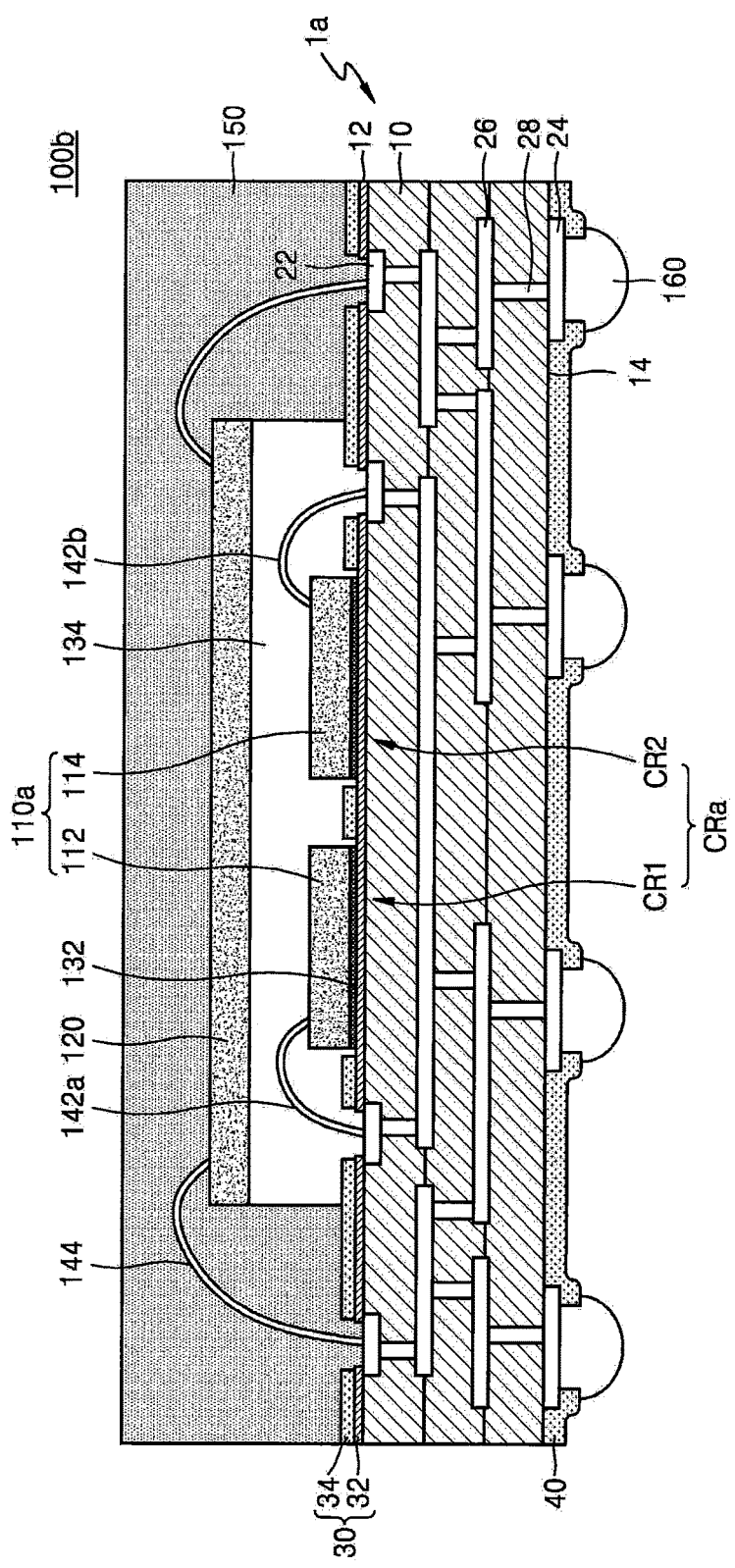
FIG. 4 is a cross-sectional view illustrating a semiconductor package according to an embodiment.

FIG. 4 is a cross-sectional view illustrating a semiconductor package according to an embodiment. In describing FIG. 4, details repetitive of FIGS. 1A to 2C may be omitted.

Referring to FIG. 4, the semiconductor package 100b may include a PCB 1a and a plurality of semiconductor chips 110a and 120 attached to the PCB 1a. The semiconductor chips 110a and 120 may a lower semiconductor chip 110a and an upper semiconductor chip 120.

The PCB 1a may include a substrate base 10, a top pad 22 disposed on a top surface 12 of the substrate base 10, and a top solder resist layer 30 formed on the top surface 12 of the substrate base 10. The substrate base 10 may include a plurality of base layers which are stacked thereon. The substrate base 10 may include a chip attach area CRa where the lower semiconductor chip 110a is attached to the top surface 12.

The PCB 1a may further include a bottom pad 24 disposed on a bottom surface 14 of the substrate base 10 and a bottom solder resist layer 40 formed on the bottom surface 14 of the substrate base 10. The semiconductor package 100b may further include an external connection member 160 attached to a bottom of the PCB 1a.

The top solder resist layer 30 may include a first top solder resist layer 32 and a second top solder resist layer 34.

The lower semiconductor chip 110a may include first and second lower semiconductor chips 112 and 114. The chip attach area CRa may include a first chip attach area CR1 and a second chip attach area CR2 which are spaced apart from each other. In FIG. 4, it is illustrated that the lower semiconductor chip 110a includes two semiconductor chips (i.e., the first and second lower semiconductor chips 112 and 114) and the chip attach area CRa includes two chip attach areas (i.e., the first and second chip attach areas CR1 and CR2), but some embodiments of the inventive concepts are not limited thereto. In other embodiments, the lower semiconductor chip 110a may include three or more semiconductor chips, and the chip attach area CRa may include three or more chip attach areas.

The first top solder resist layer 32 may include a first pad opening (32P of FIG. 1C) corresponding to the top pad 22 and may cover the chip attach area CRa of the substrate base 10. The top pad 22 may be a portion of a conductive pattern disposed on the top surface 12 of the substrate base 10 exposed by the first pad opening 32P. The first top solder resist layer 32 may cover the entire chip attach area CRa of the substrate base 10.

The second top solder resist layer 34 may include a second pad opening (34P of FIG. 1C) corresponding to the top pad 22 and may be formed on the first top solder resist layer 32 to expose the first top solder resist layer 32 in the chip attach area CRa. Only the first top solder resist layer 32 may be formed in the chip attach area CRa of the substrate base 10; the second top solder resist layer 34 may not be formed in the chip attach area CRa. That is, the second top solder resist layer 34 may include an opening, such as the chip attach opening 34C of FIG. 1B, in each of the first and second chip attach areas CR1 and CR2.

The lower semiconductor chip 110a may be attached to the chip attach area CRa of the PCB 1a. The first lower semiconductor chip 112 may be attached to the first chip attach area CR1 of the PCB 1a, and the second lower semiconductor chip 114 may be attached to the second chip attach area CR2. The first and second semiconductor chips 112 and 114 may be respectively attached to the first and second attach areas CR1 and CR2 of the PCB 1a with the lower die attach film 132 therebetween. Therefore, the first and second lower semiconductor chips 112 and 114 may be attached to the first top solder resist layer 32 in the first and second attach areas CR1 and CR2 of the PCB 1a (i.e., the first and second attach areas CR1 and CR2 of the substrate base 10), respectively.

Accordingly, a top of the lower semiconductor chip 110a may be at a level that is lower than a main surface of the substrate base 10 by a thickness of the second top solder resist layer 34 (t2 of FIG. 1B) relative to a surface of the PCB 1a.

The first and second lower semiconductor chips 112 and 114 may be electrically connected to the PCB 1a by first and second lower bonding wires 142a and 142b, respectively. The upper semiconductor chip 120 may be stacked on the lower semiconductor chip 110a. The upper semiconductor chip 120 may be electrically connected to the PCB 1a by an upper bonding wire 144.

The upper semiconductor chip 120 may be attached to tops of each of the first and second lower semiconductor chips 112 and 114. The upper semiconductor chip 120 may overlap the first and second lower semiconductor chips 112 and 114 in a direction vertical to a main surface of the PCB 1a.

The upper semiconductor chip 120 may be stacked on the lower semiconductor chip 110a with an upper die attach film 134 between the PCB 1a and the upper semiconductor chip 120. The upper die attach film 134 may surround at least a portion of the lower semiconductor chip 110a. In some embodiments, the upper die attach film 134 may surround all portions of the lower semiconductor chip 110a except a portion contacting the PCB 1a. The upper die attach film 134 may surround the lower bonding wires 142a and 142b. In some embodiments, the lower semiconductor chip 110a and the lower bonding wires 142a and 142b may be buried in the upper die attach film 134.

In the pad openings 32P and 34P of the top solder resist layer 30 corresponding to the top pad 22, a portion far away from the top pad 22 (i.e., the second pad opening 34P) may have an area wider than that of a portion close to the top pad 22 (i.e., the first pad opening 32P). Therefore, a loop of each of the lower bonding wires 142a and 142b and the upper bonding wire 144 connected to the top pad 22 may be easily formed.

A mold layer 150 may be formed on a top of the PCB 1a. The mold layer 150 may be formed on the top of the PCB 1a to surround the lower semiconductor chip 110a, the upper semiconductor chip 120, and the bonding wires 142a, 142b and 144.

In the semiconductor package 100b according to some embodiments, a distance from a top of the top solder resist layer 30 to a top of the lower semiconductor chip 110a may be reduced, and thus, a distance from the top the top solder resist layer 30 to an uppermost end of the upper semiconductor chip 120 may also be reduced. Therefore, the semiconductor package 100b according to an embodiment may have a relatively small thickness.

Figure 5:
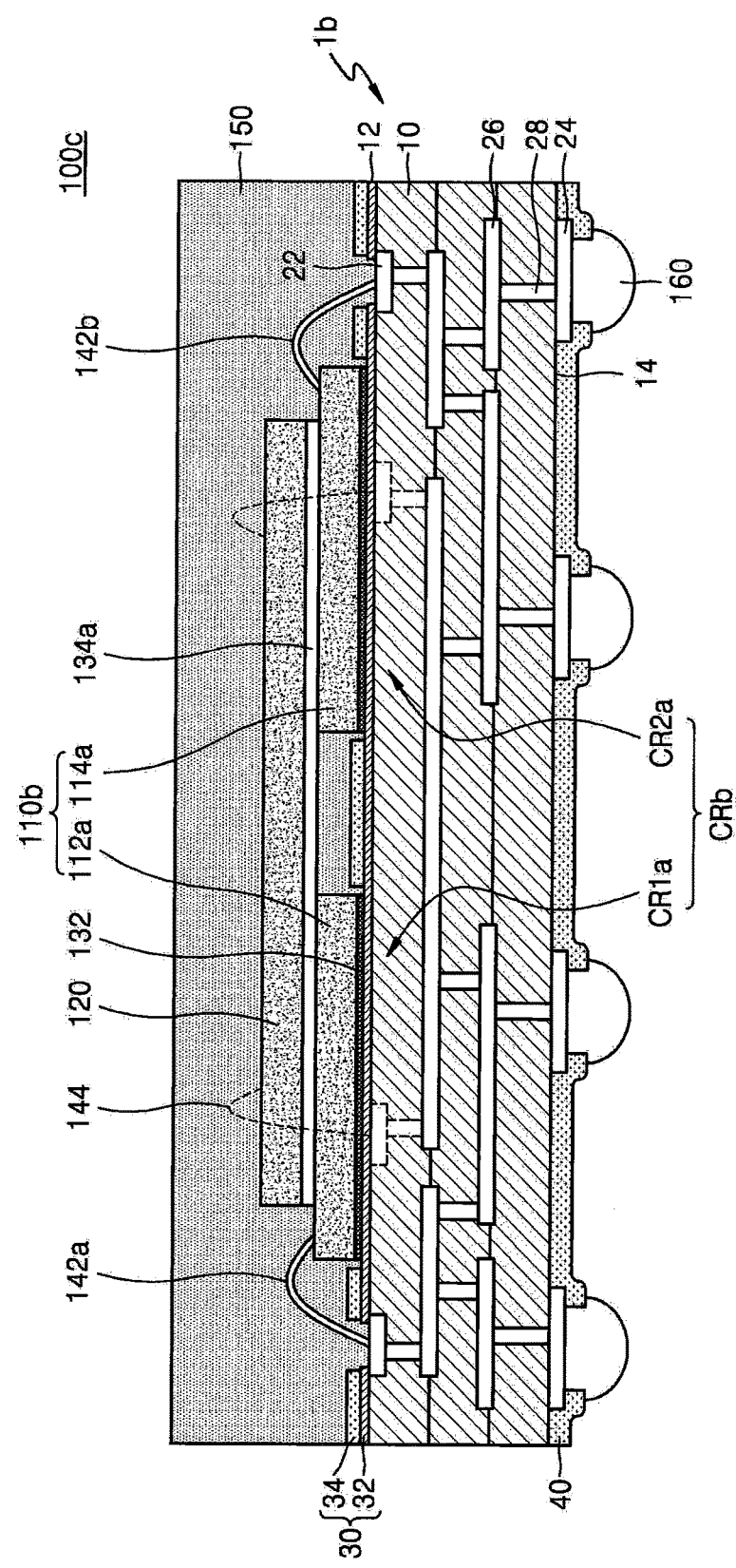
FIG. 5 is a cross-sectional view illustrating a semiconductor package according to an embodiment.

FIG. 5 is a cross-sectional view illustrating a semiconductor package 100c according to further embodiments of the inventive concepts. In describing FIG. 5, details repetitive of FIGS. 1A to 4 may be omitted.

Referring to FIG. 5, the semiconductor package 100c may include a PCB 1b and a plurality of semiconductor chips 110b and 120 attached to the PCB 1b. The semiconductor chips 110b and 120 may include a lower semiconductor chip 110b and an upper semiconductor chip 120.

The PCB 1b may include a substrate base 10, a top pad 22 disposed on a top surface 12 of the substrate base 10, and a top solder resist layer 30 formed on the top surface 12 of the substrate base 10. The substrate base 10 may include a plurality of base layers which are stacked thereon. The substrate base 10 may include a chip attach area CRb where the lower semiconductor chip 110b is attached to the top surface 12.

The PCB 1b may further include a bottom pad 24 disposed on a bottom surface 14 of the substrate base 10 and a bottom solder resist layer 40 formed on the bottom surface 14 of the substrate base 10. The semiconductor package 100c may further include an external connection member 160 attached to a bottom surface of the PCB 1b.

The top solder resist layer 30 may include a first top solder resist layer 32 and a second top solder resist layer 34.

The lower semiconductor chip 110b may include first and second lower semiconductor chips 112a and 114a. The chip attach area CRb may include a first chip attach area CR1a and a second chip attach area CR2a which are spaced apart from each other. In FIG. 5, it is illustrated that the lower semiconductor chip 110b includes two semiconductor chips (i.e., the first and second lower semiconductor chips 112a and 114a) and the chip attach area CRb includes two chip attach areas (i.e., the first and second chip attach areas CR1a and CR2a), but some embodiments of the inventive concepts are not limited thereto. In other embodiments, the lower semiconductor chip 110b may include three or more semiconductor chips, and the chip attach area CRb may include three or more chip attach areas.

The first top solder resist layer 32 may include a first pad opening (32P of FIG. 1C) corresponding to the top pad 22 and may cover the chip attach area CRb of the substrate base 10. The top pad 22 may be a portion of a conductive pattern disposed on the top surface 12 of the substrate base 10 exposed by the first pad opening 32P. The first top solder resist layer 32 may cover the entire chip attach area CRb of the substrate base 10.

The second top solder resist layer 34 may include a second pad opening (34P of FIG. 1C) corresponding to the top pad 22 and may be formed on the first top solder resist layer 32 to expose the first top solder resist layer 32 in the chip attach area CRb. Only the first top solder resist layer 32 is formed in the chip attach area CRb of the substrate base 10; the second top solder resist layer 34 may not be formed in the chip attach area CRb. That is, the second top solder resist layer 34 may include an opening, such as the chip attach opening 34C of FIG. 1B, in each of the first and second chip attach areas CR1a and CR2a.

The lower semiconductor chip 110b may be attached to the chip attach area CRb of the PCB 1b. The first lower semiconductor chip 112a may be attached to the first chip attach area CR1a of the PCB 1b, and the second lower semiconductor chip 114a may be attached to the second chip attach area CR2a. The first and second semiconductor chips 112a and 114a may be respectively attached to the first and second attach areas CR1a and CR2a of the PCB 1b with the lower die attach film 132 therebetween. Therefore, the first and second lower semiconductor chips 112a and 114a may be attached to the first top solder resist layer 32 in the first and second attach areas CR1a and CR2a of the PCB 1b (i.e., the first and second attach areas CR1a and CR2a of the substrate base 10), respectively.

Accordingly, a top of the lower semiconductor chip 110b may have a level that is lower than a main surface of the substrate base 10 by a thickness (t2 of FIG. 1B) of the second top solder resist layer 34.

The upper semiconductor chip 120 may be stacked on the lower semiconductor chip 110b. The upper semiconductor chip 120 may be attached to a top surface of each of the first and second lower semiconductor chips 112a and 114a. The upper semiconductor chip 120 may overlap at least a portion of each of the first and second lower semiconductor chips 112a and 114a in a direction vertical to a main surface of the PCB 1b. In FIG. 5, it is illustrated that the upper semiconductor chip 120 overlaps at least a portion of each of the first and second lower semiconductor chips 112a and 114a, but some embodiments of the inventive concepts are not limited thereto. In some embodiments, the upper semiconductor chip 120 may overlap an entire portion of at least one of the lower semiconductor chips 110b and may overlap only a portion of the other lower semiconductor chip 110b.

The upper semiconductor chip 120 may be stacked on the lower semiconductor chip 110b with an upper die attach film 134a therebetween. The upper die attach film 134a may have, for example, a characteristic that is the same as or similar to that of a lower die attach film 132 or the die attach film 132 of FIG. 3. The upper die attach film 134a may cover an entire bottom of the upper semiconductor chip 120 and may cover only a portion of a top of the lower semiconductor chip 110b overlapping the upper semiconductor chip 120.

The first and second lower semiconductor chips 112a and 114a may be electrically connected to the PCB 1b by first and second lower bonding wires 142a and 142b, respectively. The first lower bonding wire 142a may connect the top pad 22 and a bonding pad (not shown) formed on a top of the first lower semiconductor chip 112a, and the second lower bonding wire 142b may connect the top pad 22 and a bonding pad (not shown) formed on a top of the second lower semiconductor chip 114a. The bonding pad of the first lower semiconductor chip 112a may be formed in a portion, which does not overlap the upper semiconductor chip 120, of the top of the first lower semiconductor chip 112a, and the bonding pad of the second lower semiconductor chip 114a may be formed in a portion, which does not overlap the upper semiconductor chip 120, of the top of the second lower semiconductor chip 114a.

The upper semiconductor chip 120 may be electrically connected to the PCB 1b by an upper bonding wire 144.

In the pad openings 32P and 34P of the top solder resist layer 30 corresponding to the top pad 22, a portion (i.e., the second pad opening 34P) far away from the top pad 22 may have an area wider than that of a portion (i.e., the first pad opening 32P) close to the top pad 22. Therefore, a loop of each of the lower bonding wires 142a and 142b and the upper bonding wire 144 connected to the top pad 22 may be easily formed.

A mold layer 150 may be formed on a top of the PCB 1b. The mold layer 150 may be formed on the top of the PCB 1b to surround the lower semiconductor chip 110b, the upper semiconductor chip 120, and the bonding wires 142a, 142b and 144. The mold layer 150 may fill a space between the first and second lower semiconductor chips 112a and 114a under the upper semiconductor chip 120.

In the semiconductor package 100c according to some embodiments, a height from a top of the top solder resist layer 30 to a top of the lower semiconductor chip 110a may be reduced, and thus, a height from the top the top solder resist layer 30 to an uppermost end of the upper semiconductor chip 120 may also be reduced. Therefore, the semiconductor package 100c according to an embodiment may have a relatively small thickness.

FIGS. 6 to 10 are cross-sectional views that illustrate methods of manufacturing a PCB according to some embodiments. In describing FIGS. 6 to 10, details repetitive of FIGS. 1A to 5 may be omitted.

Figure 6:
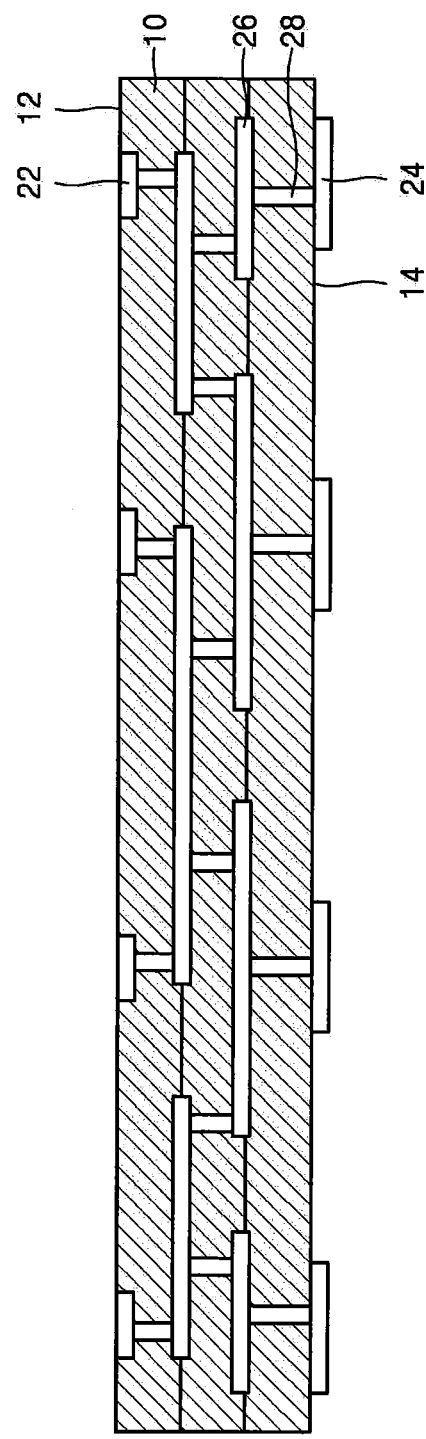
FIGS. 6 to 10 are cross-sectional views incrementally illustrating a method of manufacturing a PCB according to an embodiment.

Referring to FIG. 6, a substrate base 10 where an internal conductive layer 26 and a conductive via 28 are formed and a conductive pattern including a top pad 22 and a bottom pad 24 respectively disposed on a top surface 12 and a bottom surface 14 is disposed may be provided. The substrate base 10 may include a plurality of base layers which are stacked. The internal conductive layer 26 may be disposed between adjacent base layers.

The top pad 22 may be inlaid into the substrate base 10 to have the ETS. For example, the top pad 22 may be disposed in the substrate base 10 in order for a top of the top pad 22 and the top surface 12 of the substrate base 10 to have the same level. The bottom pad 24 may protrude from the substrate base 10.

Figure 7:
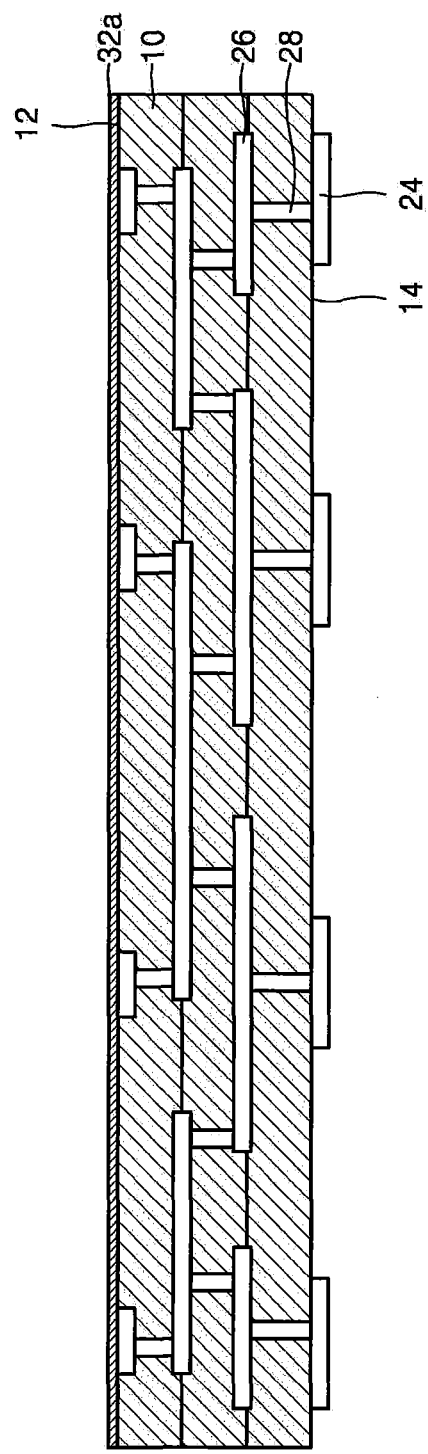

Referring to FIG. 7, a first auxiliary top solder resist layer 32a may be formed on the top surface 12 of the substrate base 10. The first auxiliary top solder resist layer 32a may be formed by, for example, a process in which a photo-imageable solder resist is overall coated on the top surface 12 of the base substrate 10 by a screen printing process or a spray coating process, or a process in which a film-type solder resist material is adhered to the top surface 12 by a laminating process.

Figure 8:
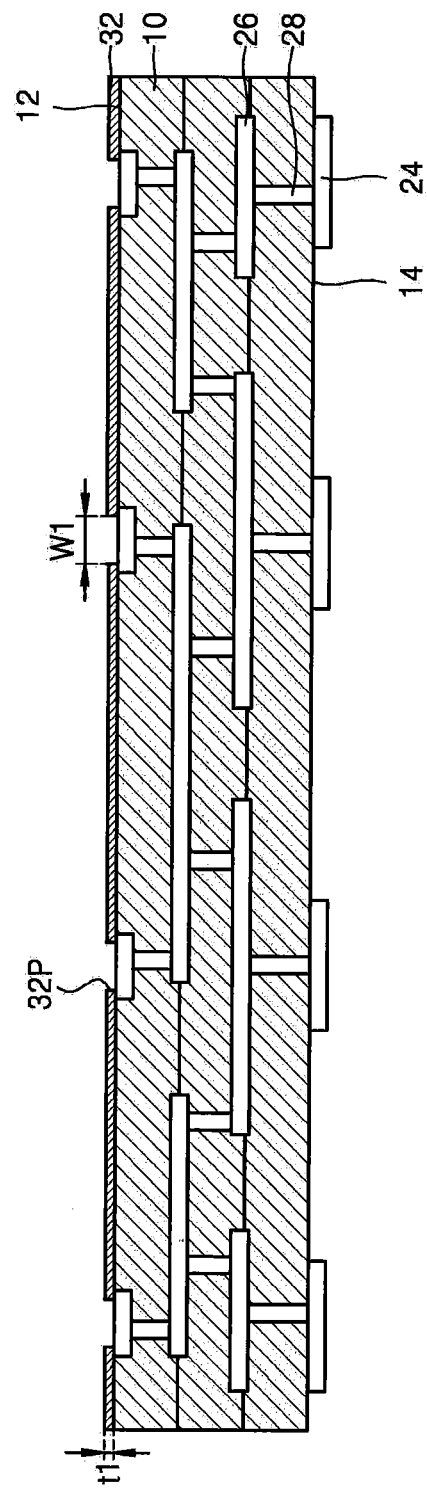

Referring to FIGS. 7 and 8, a first top solder resist layer 32 may be formed on the top surface 12 of the substrate base 10. The first top solder resist layer 32 may be formed by a process in which an undesired portion of the first auxiliary top solder resist layer 32a is removed by an exposure and development process, and a hardening process is performed using heat, UV, or IR energy.

The first top solder resist layer 32 may have a first thickness t1. The undesired portion removed from the first auxiliary top solder resist layer 32a may correspond to a first pad opening 32P having a first width W1 in the first top solder resist layer 32.

In some embodiments, without forming the first auxiliary top solder resist layer 32a, the first top solder resist layer 32 may be formed by, for example, a process in which a solder mask insulating layer is coated on the top surface 12 of the base substrate 10 by the screen printing process or an inkjet printing process, and then is hardened using heat, UV, or IR energy.

Figure 9:
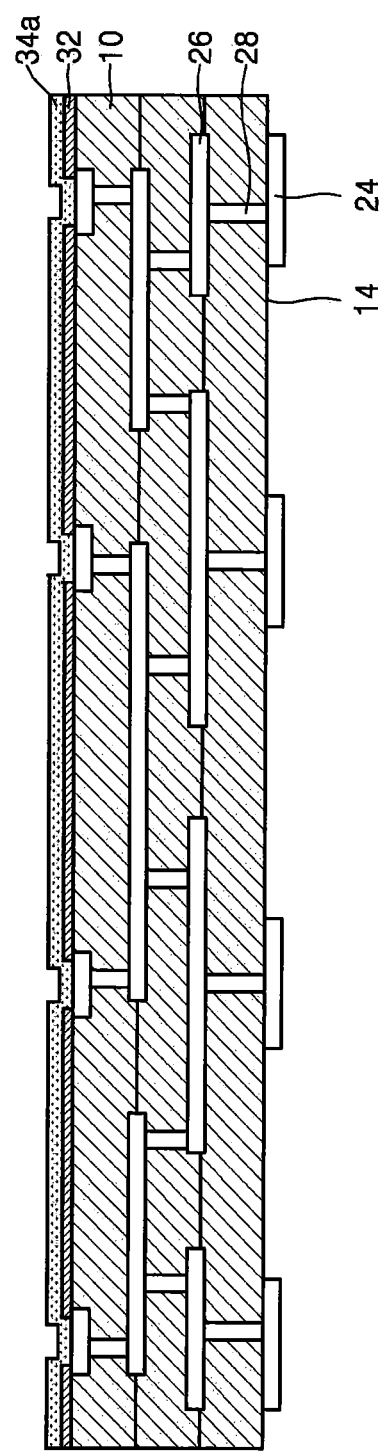

Referring to FIG. 9, a second auxiliary top solder resist layer 34a may be formed on the top surface 12 of the substrate base 10 where the first top solder resist layer 32 is formed. The second auxiliary top solder resist layer 34a may be formed by, for example, a process in which a photo-imageable solder resist is overall coated on the top surface 12 of the base substrate 10 by a screen printing process or a spray coating process, or a process in which a film-type solder resist material is adhered to the top surface 12 by a laminating process.

Figure 10:
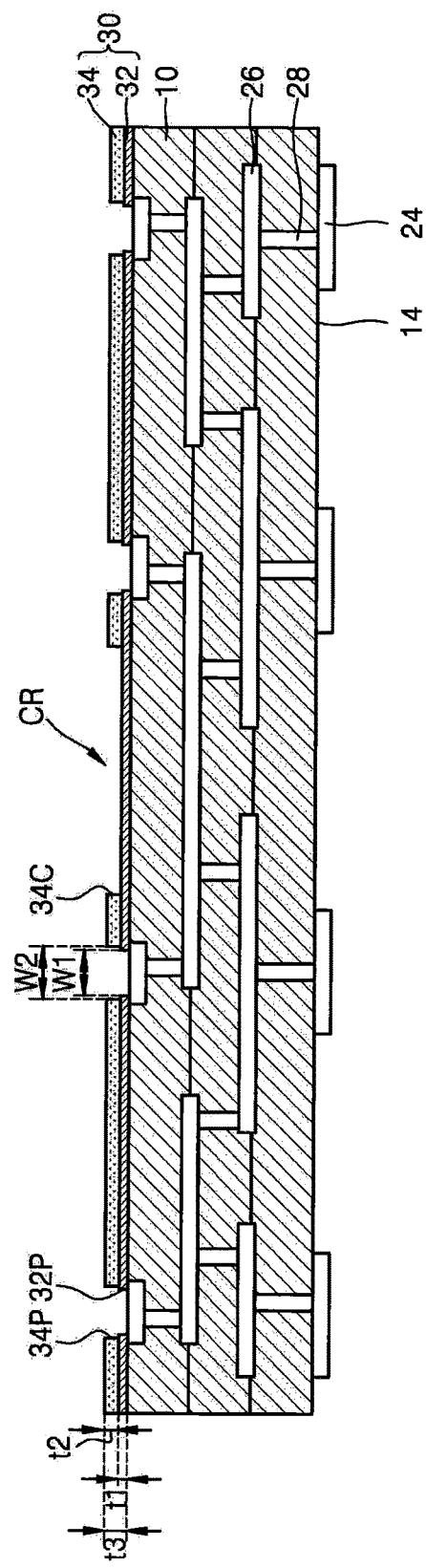
Figure 11:
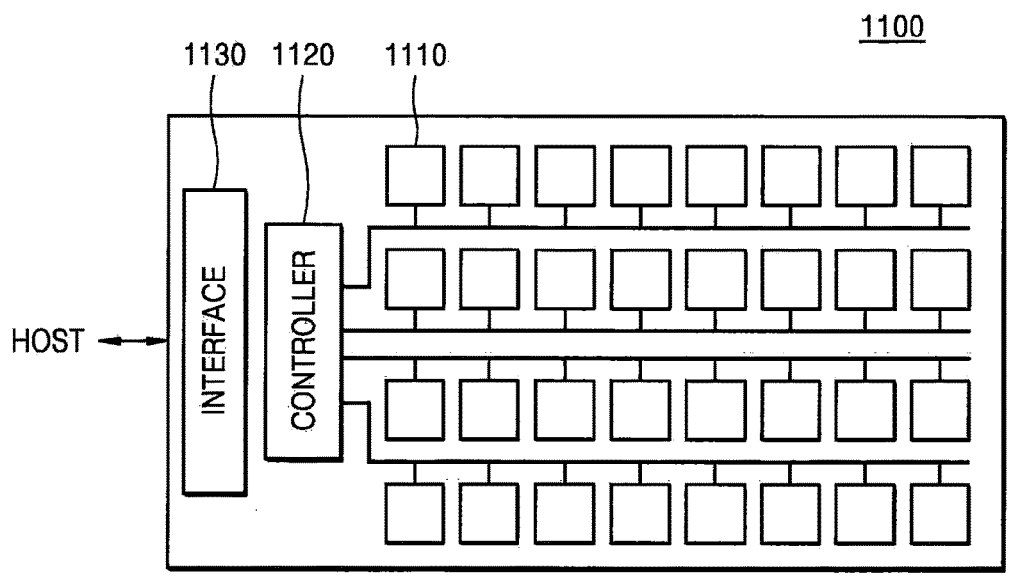
FIG. 11 is a block diagram illustrating an electronic device according to embodiments.

Referring to FIGS. 10 and 11, a second top solder resist layer 34 may be formed on the top surface 12 of the substrate base 10 where the first top solder resist layer 32 is formed. The second top solder resist layer 34 may be formed by a process where an undesired portion of the second auxiliary top solder resist layer 34a is removed by the exposure and development process, and a hardening process is performed by using heat, UV, or IR energy.

The second top solder resist layer 34 may have a second thickness t2. A third thickness t3, which is a thickness of a portion where the first and second top solder resist layers 32 and 34 are all formed in the top solder resist layer 30, may be a sum of the first thickness t1 and the second thickness t2.

The undesired portion removed from the second auxiliary top solder resist layer 34a may be a chip attach opening 34C corresponding to a chip attach area CR and a second pad opening 34P having a second width W2 in the second top solder resist layer 34.

In some embodiments, without forming the second auxiliary top solder resist layer 34a, the second top solder resist layer 34 may be formed by, for example, a process in which a solder mask insulating layer is coated on the top surface 12 of the base substrate 10 by a screen printing process or an inkjet printing process and then is hardened by applying heat, UV, or IR energy.

Subsequently, as illustrated in FIG. 1, a PCB 1 may be formed by forming a bottom solder resist layer 40. The bottom solder resist layer 40 may be formed by, for example, a process in which a solder mask insulating layer is coated on the bottom surface 14 of the base substrate 10 by a screen printing process or an inkjet printing process and then is hardened by applying heat, UV, or IR energy.

The bottom solder resist layer 40 may be formed by, for example, a process where a photo-imageable solder resist is coated on the bottom surface 14 of the base substrate 10 by the screen printing process or the spray coating process or a film-type solder resist material is adhered to the bottom surface 14 by the laminating process, an undesired portion is removed by an exposure and development process, and a hardening process is performed using heat, UV, or IR energy.

FIG. 11 is a block diagram illustrating an electronic device according to some embodiments. In FIG. 11, a solid state drive (SSD) 1100 is illustrated as an electronic device including a semiconductor package.

Referring to FIG. 11, the SSD 1100 may include a plurality of nonvolatile memory 1110 and a controller 1120. All or some elements of the SSD 1100 may be one of the semiconductor packages 100, 100a, 100b, and 100c described above with reference to FIGS. 1 to 10.

The nonvolatile memory 1110 may store data and may have nonvolatile characteristic where stored data is maintained as-is even when power is cut off. The nonvolatile memory 1110 may be one of the upper semiconductor chips 120 and 120a described above with reference to FIGS. 1 to 10.

In response to a read/write request of a host, the controller 1120 may read the data stored in the nonvolatile memory 1110 or may store data in the nonvolatile memory 1110. An interface 1130 may transmit a command signal and an address signal to the host or may receive the command signal and the address signal from the host, and may again transmit the command signal and the address signal to the nonvolatile memory 1110 through the controller 1120 or may receive the command signal and the address signal from the nonvolatile memory 1110. The controller 1120 and/or the interface 1130 may be one of the lower semiconductor chips 110, 110a and 110b described above with reference to FIGS. 1 to 10.

Figure 12:
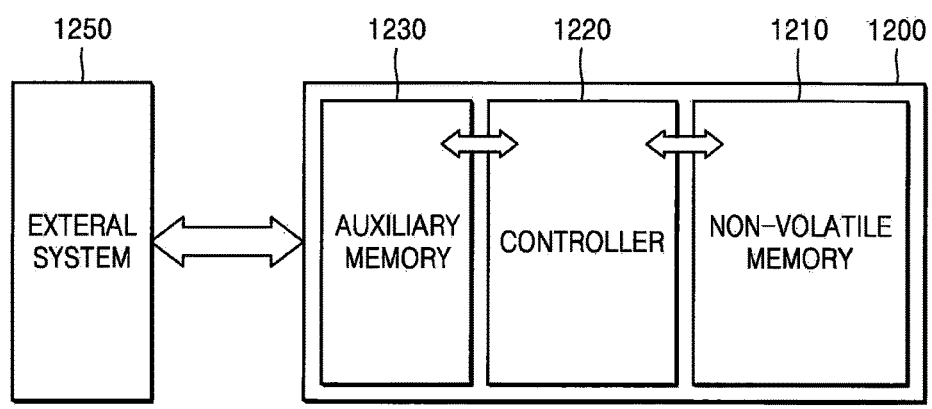
FIG. 12 is a schematic diagram illustrating a relationship between an external system and an electronic device according to embodiments.

FIG. 12 is a schematic diagram illustrating a relationship between an external system and an electronic device according to embodiments. In FIG. 12, an SSD 1200 is illustrated as an electronic device including a semiconductor package.

Referring to FIG. 12, data input from an external system 1250 may be stored in the SSD 1200. The SSD 1200 may include a nonvolatile memory 1210, a controller 1220, and an auxiliary memory 1230. All or some elements of the SSD 1200 may be one of the semiconductor packages 100, 100a, 100b, and 100c described above with reference to FIGS. 1 to 10.

The data input from the external system 1250 may be stored in the nonvolatile memory 1210 via the auxiliary memory 1230 and the controller 1220. Also, the controller 1220 may read data from the nonvolatile memory 1210 through the auxiliary memory 1230 to transmit the read data to the external system 1250.

The nonvolatile memory 1210 may be one of the upper semiconductor chips 120 and 120a described above with reference to FIGS. 1 to 10. The controller 1220 may be one of the lower semiconductor chips 110, 110a and 110b described above with reference to FIGS. 1 to 10. The auxiliary memory 1230 may be one of the lower semiconductor chips 110, 110a and 110b described above with reference to FIGS. 1 to 10.

Figure 13:
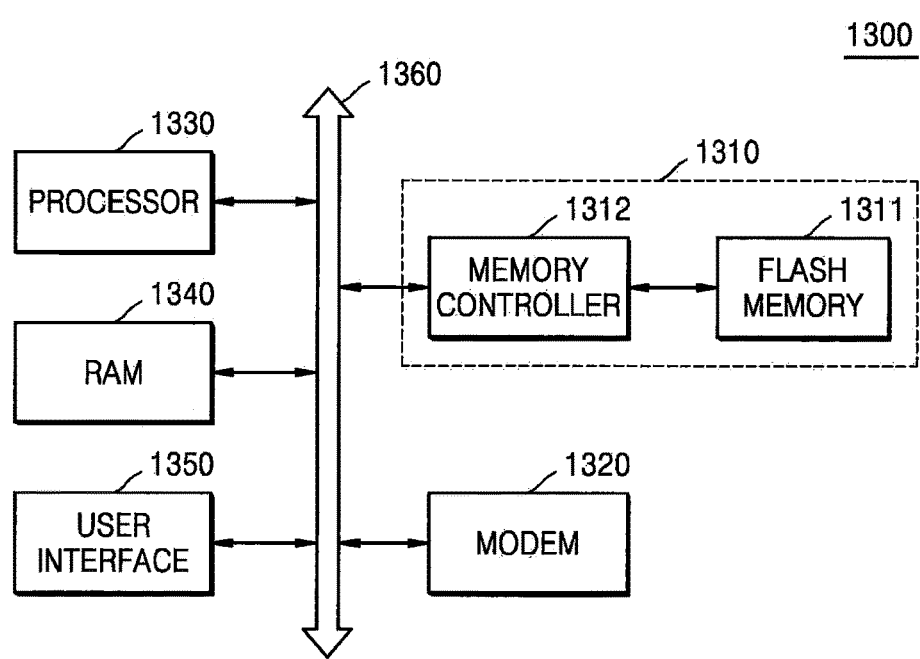
FIG. 13 is a block diagram of a system according to embodiments.

FIG. 13 is a block diagram of a system according to embodiments. In FIG. 13, a storage device is illustrated as an electronic device included in the system.

Referring to FIG. 13, a data storage system 1300 may include a processor 1330 such as a central processing unit (CPU) which performs communication through a common bus 1360, an RAM 1340, a user interface 1350, and a modem 1320. Each of the elements may transmit a signal to a storage device 1310 through the common bus 1360 and may receive the signal from the storage device 1310. All or some elements of the storage device 1310 may be one of the semiconductor packages 100, 100a, 100b, and 100c described above with reference to FIGS. 1 to 10.

The storage device 1310 may include a flash memory 1311 and a memory controller 1312. The flash memory 1311 may store data and may have nonvolatile characteristic where stored data is maintained as-is even when power is cut off. The flash memory 1311 may be one of the upper semiconductor chips 120 and 120*a* described above with reference to FIGS. 1 to 10. The memory controller 1312 may be one of the lower semiconductor chips 110, 110*a* and 110*b* described above with reference to FIGS. 1 to 10.

In the PCB and the semiconductor package including the same according to the embodiments, since a top of a semiconductor chip attached to the PCB has a low level, an adhesive force between the semiconductor chip and the PCB is enhanced, and a thickness of the semiconductor package is relatively thin.

Moreover, a portion, which is farther away from a pad, among portions of an opening of a solder resist layer, has a wider area to correspond to a pad connected to a bonding wire, and thus, a loop of the bonding wire connected to the pad is freely formed.

While the inventive concept has been particularly shown and described with reference to exemplary embodiments thereof, it will be understood that various changes in form and details may be made therein without departing from the spirit and scope of the following claims.

What is claimed is:

1. A printed circuit board (PCB) comprising:
   a substrate base including a chip attach area on a top surface thereof;
   a top pad and a bottom pad respectively on the top surface and a bottom surface of the substrate base;
   a first top solder resist layer on the top surface of the substrate base, the first top solder resist layer including a first pad opening corresponding to the top pad and covering the chip attach area;
   a second top solder resist layer on the first top solder resist layer, the second top solder resist layer including a second pad opening corresponding to the top pad and a chip attach opening corresponding to the chip attach area; and
   a bottom solder resist layer on the bottom surface of the substrate base, the bottom solder resist layer including a third pad opening corresponding to the bottom pad,
   wherein a width of the second pad opening is larger than a width of the first pad opening.

2. The PCB of claim 1, wherein a thickness of the first top solder resist layer is smaller than a thickness of the second top solder resist layer.

3. The PCB of claim 1, wherein the first top solder resist layer covers an entire portion of the chip attach area of the substrate base.

4. The PCB of claim 1, wherein
   the top pad is inlaid in the substrate base such that a top surface of the top pad and the top surface of the substrate base are at the same level, and
   the bottom pad protrudes from the bottom surface of the substrate base.

5. The PCB of claim 2, wherein a thickness of the bottom solder resist layer is larger than a thickness of either of the first and second top solder resist layers.

6. A semiconductor package comprising:
   a printed circuit board (PCB) including:
      a substrate base including a chip attach area on a top thereof;
      a top pad and a bottom pad respectively on the top and a bottom of the substrate base;
      a top solder resist layer including a first top solder resist layer including a first pad opening corresponding to the top pad and covering the chip attach area, and a second top solder resist layer including a second pad opening corresponding to the top pad and a chip attach opening corresponding to the chip attach area, the first and second top solder resist layers being sequentially stacked on the top of the substrate base; and
      a bottom solder resist layer on the bottom of the substrate base, the bottom solder resist layer including a third pad opening corresponding to the bottom pad;
   a lower semiconductor chip attached to the first top solder resist layer in the chip attach area of the substrate base with a lower die attach film therebetween;
   an upper semiconductor chip on the lower semiconductor chip; and
   a bonding wire that electrically connects at least one of the upper and lower semiconductor chips to the top pad through the first and second pad openings.

7. The semiconductor package of claim 6, wherein
   a thickness of the first top solder resist layer is smaller than a thickness of the second top solder resist layer, and
   a thickness of the lower die attach film is smaller than the thickness of the second top solder resist layer.

8. The semiconductor package of claim 6, wherein a bottom of the lower semiconductor chip has a level that is lower than a level of a top of the second top solder resist layer with respect to a main surface of the substrate base.

9. The semiconductor package of claim 6, wherein
   the upper semiconductor chip is stacked on the lower semiconductor chip with an upper die attach film between the PCB and the upper semiconductor chip, and
   the upper die attach film surrounds at least a portion of the lower semiconductor chip.

10. The semiconductor package of claim 6, wherein
    the chip attach area comprises a first chip attach area and a second chip attach area which are spaced apart from each other, and
    the lower semiconductor chip comprises a first lower semiconductor chip attached to the first top solder resist layer in the first chip attach area and a second lower semiconductor chip attached to the first top solder resist layer in the second chip attach area.

11. The semiconductor package of claim 6, wherein the second pad opening has an area greater than an area of the first pad opening.

12. The semiconductor package of claim 10, wherein the upper die attach film covers a portion, of a top surface of each of the first and second lower semiconductor chips that is overlapped with the upper semiconductor chip.

13. The semiconductor package of claim 10, wherein
    the upper semiconductor chip is stacked on the first and second lower semiconductor chips with an upper die attach film between the PCB and the upper semiconductor chip, and
    the upper die attach film surrounds at least a portion of each of the first and second lower semiconductor chips.

14. The semiconductor package of claim 10, wherein
    the upper semiconductor chip is stacked on the first and second lower semiconductor chips with an upper die attach film between the PCB and the upper semiconductor chip, and
    the upper semiconductor chip overlaps at least a portion of each of the first and second lower semiconductor chips in a direction vertical to a main surface of the PCB.

15. A printed circuit board (PCB) comprising:
a substrate including a chip attach area on a top surface of the substrate;
a top pad on the top surface of the substrate;
a bottom pad on a bottom surface of the substrate;
a first top solder resist layer on the top surface of the substrate, the first top solder resist layer including a first pad opening corresponding to the top pad, wherein the first top solder resist layer is on the chip attach area;
a second top solder resist layer on the first top solder resist layer, the second top solder resist layer including a second pad opening corresponding to the top pad and a chip attach opening corresponding to the chip attach area, wherein an area of the second pad opening is greater than an area of the first pad opening; and
a bottom solder resist layer on the bottom surface of the substrate, the bottom solder resist layer including a third pad opening corresponding to the bottom pad, wherein the top pad is electrically connected to the bottom pad.

16. The PCB of claim 15, wherein a thickness of the first top solder resist layer is smaller than a thickness of the second top solder resist layer.

17. The PCB of claim 15, wherein a thickness of the bottom solder resist layer is larger than a thickness of either of the first and second top solder resist layers.

18. The PCB of claim 15, wherein the first top solder resist layer covers an entire portion of the chip attach area of the substrate.

19. The PCB of claim 15, wherein
the top pad is inlaid in the substrate such that a top surface of the top pad and the top surface of the substrate are at the same level, and
the bottom pad protrudes from the bottom of the substrate.

* * * * *